Jan. 21, 1964 E. O. KEIZER 3,119,079

VARIABLE-CAPACITANCE DIODE BALANCED MODULATOR

Filed Nov. 29, 1960

INVENTOR.
EUGENE O. KEIZER
BY
Eugene M. Whitacre
Attorney

United States Patent Office 3,119,079

Patented Jan. 21, 1964

3,119,079
VARIABLE-CAPACITANCE DIODE BALANCED MODULATOR

Eugene O. Keizer, Princeton, N.J., assignor to Radio Corporation of America, a corporation of Delaware Filed Nov. 29, 1960, Ser. No. 72,343
1 Claim. (Cl. 332—47)

This invention relates to circuits utilizing voltage-responsive variable-capacitance diodes and more particularly relates to stabilization of such circuits.

When reverse biased, a variable-capacitance diode exhibits a capacitance which depends upon the magnitude of the reverse biasing voltage. At lower magnitudes of reverse biasing voltage, the capacitance exhibited by the variable-capacitance diode is very sensitive to temperature variations. Relatively small changes in temperature cause significant changes in the capacitance exhibited by the diode and therefore circuits utilizing the capacitance characteristic of such diodes tend to be unstable.

Accordingly, it is an object of this invention to provide an improved circuit which utilizes the capacitance characteristic of variable capacitance diodes and is stable in operation.

It is another object of this invention to provide an improved variable-capacitance diode circuit which is stabilized against temperature variations.

It is another object of this invention to provide a variable capacitance diode circuit which automatically compensates for changes in capacitance due to temperature changes.

In accordance with the invention, a variable-capacitance diode is reverse biased to exhibit a desired value of capacitance. A forward-biased diode is provided to comprise a portion of the reverse biasing circuit. The forward-biased diode is coupled into the reverse biasing circuit in a manner whereby changes in temperature vary the reverse bias in a direction which opposes variations in capacitance of the variable-capacitance diode due to temperature changes.

In one embodiment of the invention, a variable-capacitance diode is reverse biased to exhibit a desired capacitance and is coupled to an inductor to provide a tunable resonant circuit which is temperature stabilized to prevent detuning the circuit. In another embodiment of the invention, a reverse-biased variable-capacitance diode is coupled to a fixed capacitor to comprise a voltage-responsive reactance voltage divider network. The voltage divider network is utilized as a balanced modulator which is temperature stabilized to prevent unbalancing and consequent modulation distortion.

Figure 1:
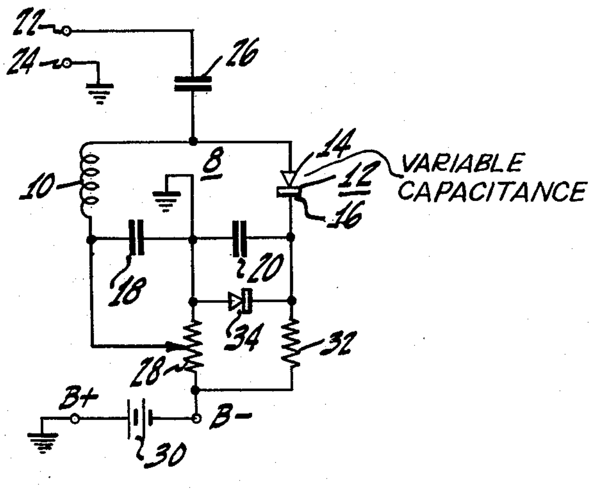
Figure 2:
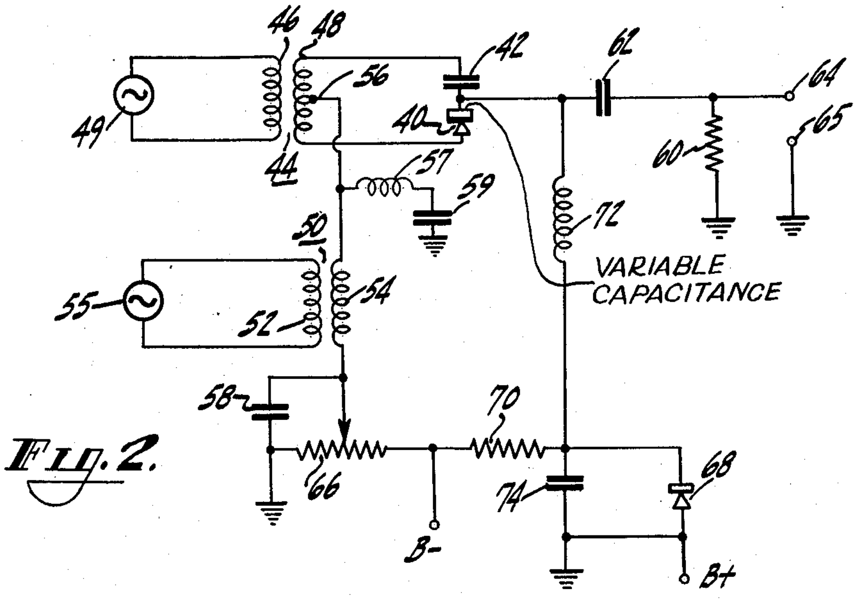

The novel features which are considered to be characteristic of this invention are set forth with particularity in the appended claim. The invention itself, however, both as to its organization and method of operation as well as additional advantages and objects thereof will best be understood by referring to the accompanying drawing in which:

FIGURE 1 is a schematic circuit diagram of a tuned resonant circuit embodying the invention, and, FIGURE 2 is a schematic circuit diagram of a balanced modulator embodying the invention.

Referring to the drawing and particularly to FIGURE 1, a resonant circuit 8 includes the parallel combination of an inductor 10 and a variable-capacitance diode 12 having an anode 14 and a cathode 16. One terminal of the inductor 10 is connected to the anode 14 of the diode 12 while the other terminal is connected to a point of reference potential in the circuit, or ground, through a bypass capacitor 18. The diode 12 is also grounded for A.C. (alternating current) operation by connecting a bypass capacitor 20 from the cathode 16 to ground. A pair of terminals 22 and 24, of which terminal 24 is grounded, is provided for connection to a source of alternating signals, not shown. The resonant circuit 8 is coupled to the alternating signal source by connecting the anode 14 of the diode 12 to the terminal 22 through a bypass capacitor 26. A reverse-biasing circuit for the variable-capacitance diode 12 includes a potentiometer 28 which is connected across the terminals of a power supply, such as a battery, 30, the positive terminal of which is grounded. Included in the reverse biasing circuit is a temperature compensating voltage divider network, including the series combination of a resistor 32 and a diode 34 which are also connected across the terminals of the power supply 30. The diode 34 is forward biased by connecting the anode thereof to the grounded B+ terminal of the power supply 30 and the cathode thereof to the negative terminal of the power supply 30 through the current limiting resistor 32.

Reverse biasing voltage is applied to the variable-capacitance diode 12 by coupling the adjustable arm of the potentiometer 28 to the anode 14 of the diode 12 through the inductor 10 and by connecting the cathode of the forward-biased diode 34 to the cathode 16 of the variable-capacitance diode 12.

The difference between the potential appearing at the adjustable arm of the potentiometer 28 and the potential appearing at the cathode of the forward-biased diode 34 will determine the magnitude of reverse biasing voltage across the variable-capacitance diode 12. Since the voltage drop across the forward biased diode 34 is relatively small, the cathode 16 of the variable-capacitance diode 12 is close to ground or B+ potential. The anode 14 of the variable-capacitance diode 12 will however be at a relatively high negative potential when the adjustable arm of the potentiometer is close to the negative terminal of the power supply 30. Therefore, the variable-capacitance diode 12 will be reverse biased. Since the capacitance exhibited by the variable-capacitance diode 12 is an inverse function of the reverse biasing voltage, with the capacitance decreasing as the reverse bias voltage increases, the circuit 8 may be tuned to parallel resonance over a continuous band of frequencies by the poteniometer 28 within the limits imposed by the particular characteristics of the diode 12 and the necessity of avoiding the application of a forward biasing voltage thereto.

However the capacitance exhibited by the diode 12 is temperature responsive to the extent that relatively small temperature variations cause significant capacitance changes which would detune the resonant circuit 8. By including the forward-biased diode 34 in the biasing circuit as shown in FIGURE 1, the reverse biasing circuit is also made responsive to the same temperature variations and the reverse bias voltage is caused to vary in a direction which opposes any change in the diode 12 capacitance.

If the temperature increases, the capacitance exhibited by the diode 12 will also increase. However the resistance exhibited by the forward biased diode 34 decreases with increased temperature and therefore a smaller voltage drop occurs across the diode 34. The cathode 16 of the variable capacitance diode 12 will therefore become more positive and the reverse biasing voltage will increase. The increased reverse biasing voltage decreases the capacitance exhibited by the diode 12 and thereby tends to return the diode 12 capacitance to its previous magnitude. An opposite sequence results if the capacitance exhibited by the diode 12 decreases due to a lowering of temperature. Consequently, the tuned circuit 8 will be maintained substantially at resonance for a particular frequency notwithstanding temperature fluctuations.

Thus in accordance with the invention a tuned circuit utilizing a reverse-biased variable-capacitance diode as a reactance element thereof is temperature stabilized by including a temperature responsive device in the reverse biasing circuit. The temperature responsive device is selected to have a temperature characteristic substantially identical to that of the variable-capacitance diode and is coupled into the reverse biasing circuit in a manner which alters the reverse biasing voltage applied to the variable capacitance diode in a direction to oppose capacitance changes due to temperature changes in the reverse biased diode.

Referring to FIGURE 2, a temperature-stabilized balanced modulator circuit in accordance with the invention includes a variable-capacitance diode 40 connected in series with a fixed capacitor 42 to comprise a reactance voltage divider network which is voltage responsive. A transformer 44 having a primary winding 46 and a secondary winding 48 is provided to couple a source of oscillatory carrier waves 49 to the voltage divider network 40—42. The primary winding 46 is connected to the carrier wave source 49 while the secondary winding 48 is coupled to the voltage divider network by connecting one terminal of the winding to the anode of the variable-capacitance diode 40 and the other terminal to one plate of the capacitor 42. The other capacitor 42 plate and the diode 40 cathode are connected together at a junction. A transformer 50 having a primary winding 52 and a secondary winding 54 is provided to also couple a source of modulating waves 55 to the voltage divider network. The primary winding 52 of the transformer 50 is connected to the modulating wave source 55. One terminal of the secondary winding 54 is connected to a center tap 56 on the secondary winding 48 of the transformer 44, and the other terminal of the secondary winding 54 is connected to a point of reference potential, or ground, through a capacitor 58. The center tap 56 is grounded at the carrier frequency through the series combination of an inductor 57 and a capacitor 59 resonant at the carrier frequency. The junction of the voltage divider network between the fixed capacitor 42 and the variable-capacitance diode 40 is coupled to a grounded load resistor 60 through a capacitor 62. The output modulated waves are derived from a pair of output terminals 64 and 65 connected across the resistor 60.

A biasing circuit is provided for the variable-capacitance diode 40 by connecting a potentiometer 66 across the terminals of a power supply, the positive or B+ terminal of which is grounded. A temperature compensating voltage divider network is included in the biasing circuit and comprises the series combination of a diode 68 and a resistor 70 which are also connected across the power supply terminals. The diode 68 is forward biased by connecting the anode thereof to the grounded B+ terminal of the power supply and the cathode to the negative terminal of the power supply through the current limiting resistor 70. The anode of the variable-capacitance diode 40 is maintained at a negative potential by coupling the adjustable arm of the potentiometer 66 through the secondary winding 54 of the transformer 50 to the center tap 56 of the transformer 44. The cathode of the variable-capacitance diode 40 is coupled through an RF choke coil 72 to the cathode of the forward-biased control diode 68 to be maintained at a positive potential and therefore reverse biased. A capacitor 74 is connected between the cathode of the diode 68 and ground to bypass alternating current around the diode 68. It is to be noted that these connections effectively place the entire peak amplitude of the modulating wave voltage and a portion of the amplitude of the carrier wave voltage in series with the D.C. reverse biasing voltage of the diode 40. It is important that the magnitude of the D.C. reverse biasing voltage be large enough to prevent the forward biasing of the diode 40 by the A.C. peak amplitudes on alternate excursions thereof.

In operation, the moveable arm of the potentiometer 66 is adjusted to provide a reverse biasing voltage which causes the diode 40 to exhibit a capacitance substantially equal to that of the fixed capacitor 42. When the carrier wave source 49 is coupled to the voltage divider network but the modulating wave source 55 is not, the capacitive reactances of the capacitor 42 and the diode 40 will be substantially equal and the voltage developed across the diode 40 will be substantially equal to that across the capacitor 42. The output terminal 64 will be at substantially the same potential level as the center tap 56 and substantially no output voltage will be developed. Thus the circuit will be in balance with A.C. wave energy at the carrier frequency being suppressed by the voltage divider arrangement.

However, when energy from the modulating wave source 55 is applied to the transformer 50, the reactance voltage divider network comprising the diode 40 and the capacitor 42 will no longer be in balance with respect to the carrier wave source 49. The capacitance of the diode 40 is voltage responsive, and the modulating waves in their excursions will either be adding to or subtracting from the reverse bias voltage. Consequently the output voltage amplitude developed across the load resistor 60 will be varying as a function of the amplitude of the modulating waves, and amplitude modulated wave energy will be developed at the output terminals. The amplitude modulated output will contain both the sum and difference sideband frequencies of the carrier and modulating waves due to the non-linearity of the capacitance-voltage characteristic of the diode 40, but no wave energy at the carrier frequency will be developed. Thus to demodulate the output waves, the carrier would have to be reintroduced at the demodulator circuit.

Inasmuch as the variable-capacitance diode 40 is temperature sensitive, the reactance voltage divider would become unbalanced with temperature changes and thereby produce modulation distortion if the circuit were not stabilized. By including a forward-biased diode 68 subject to the same temperature changes in the biasing circuit of the variable-capacitance diode 40, the balanced modulator is rendered substantially insensitive to temperature changes.

If the temperature decreases thereby reducing the capacitance exhibited by the diode 40, the voltage drop across the forward biased diode 68 increases thereby decreasing the reverse bias of the diode 40. The decreased reverse bias increases the capacitance exhibited by the variable capacitance diode 40 and substantially counteracts any tendency of the voltage divider network to become unbalanced due to temperature changes.

Thus, in accordance with the invention, a balanced modulator, utilizing a single variable-capacitance diode in a reactance voltage divider network, is provided and is stabilized against temperature changes.

What is claimed is:

A temperature-stabilized balanced modulator comprising in combination a variable-capacitance diode and a capacitor coupled in series to form a reactance voltage divider, means for applying alternating signals of a carrier frequency to said reactance voltage divider, said means including a center-tapped impedance device across which said reactance voltage divider is connected, an output circuit coupled between the center tap of said impedance device and the junction of said variable-capacitance diode and said capacitor, a resistance voltage divider including the series combination of a temperature-responsive junction diode and a resistor adapted to be connected across a power supply in a manner to forward bias said junction diode, means coupling said resistance voltage divider to reverse bias said variable-capacitance diode to exhibit a capacitance substantially equal to said capacitor to balance said reactance voltage divider and thereby prevent said alternating signals of a carrier frequency from appearing in said output circuit, said resistance voltage divider providing means which varies the reverse bias of said variable capacitance diode in a direction to oppose capacitance changes in said variable-capacitance diode due to temperature variations thereby maintaining said reactance voltage divider temperature stabilized, and means for applying alternating signals of a modulating frequency and a varying amplitude to vary the reverse bias across said variable-capacitance diode and thereby unbalance said reactance voltage divider as a function of the varying amplitude of said alternating signals of a modulating frequency.

References Cited in the file of this patent

UNITED STATES PATENTS

| | | |
|---|---|---|
| 2,811,647 | Nilssen | Oct. 29, 1957 |
| 2,984,794 | Carter | May 16, 1961 |
| 3,023,378 | Fuller | Feb. 27, 1962 |
| 3,051,933 | Cressey et al. | Aug. 28, 1962 |

OTHER REFERENCES

Electronic Industries "Voltage-Variable Capacitors—State of the Art," December 1959, pages 90–94.